United States Patent
Lau et al.

(10) Patent No.: US 9,287,837 B2
(45) Date of Patent: Mar. 15, 2016

(54) SENSOR DEVICE

(75) Inventors: Choon How Lau, Singapore (SG); Minoru Kumahara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1057 days.

(21) Appl. No.: 13/392,183

(22) PCT Filed: Aug. 25, 2010

(86) PCT No.: PCT/JP2010/064852
§ 371 (c)(1),
(2), (4) Date: Feb. 24, 2012

(87) PCT Pub. No.: WO2011/025048
PCT Pub. Date: Mar. 3, 2011

(65) Prior Publication Data
US 2012/0147922 A1     Jun. 14, 2012

(30) Foreign Application Priority Data

Aug. 26, 2009   (JP) ................................. 2009-195986

(51) Int. Cl.
*G01K 13/00* (2006.01)
*H03F 3/393* (2006.01)
(Continued)

(52) U.S. Cl.
CPC ................ *H03F 3/393* (2013.01); *H03F 3/387* (2013.01); *H03F 3/45475* (2013.01);
(Continued)

(58) Field of Classification Search
CPC ..... H03F 3/393; H03F 3/45475; H03F 3/387; H03F 2203/45138; H03F 2200/261; H03F 2200/78; H03F 2200/264; H03M 1/0663; H03M 1/52

USPC ................ 374/163, 170, 178, 183, 184, 185; 327/512, 513
See application file for complete search history.

(56) References Cited

U.S. PATENT DOCUMENTS 6,243,034 B1 *   6/2001   Regier .......................... 341/166
2007/0146065 A1   6/2007   Yoshizawa et al.
(Continued)

FOREIGN PATENT DOCUMENTS

| CN | 1105920 | 4/2003 |
|----|---------|--------|
| CN | 1929296 | 3/2007 |

(Continued)

OTHER PUBLICATIONS

Owens, A.R. et al:"Digital signal conditioning and converison" Journal of Physics E. Scientific instruments, IOP Publishing, Bristol, GB. vol. 15, No. 8, Aug. 1, 1982, pp. 789-806.*
(Continued)

*Primary Examiner* — Lisa Caputo
*Assistant Examiner* — Janice M Soto
(74) *Attorney, Agent, or Firm* — Greenblum & Bernstein, P.L.C.

(57) ABSTRACT

A sensor device is provided with a voltage detection type sensor unit for converting a physical quantity into a voltage value and outputting a voltage signal indicating the voltage value; a chopper amplifier unit for generating a modulation signal by chopping the voltage signal output from the sensor unit with a predetermined chopping frequency, amplifying the modulation signal into an amplification signal, then demodulating the amplification signal and outputting it as an output signal; an integration unit including an operational amplifier, an input resistor connected to the inverting input terminal of the operational amplifier and a capacitor connected between the inverting input terminal and an output terminal of the operational amplifier; and a digital conversion unit for converting the output signal integrated by the integration unit into a digital signal.

9 Claims, 8 Drawing Sheets

(51) Int. Cl.
H03F 3/387 (2006.01)
H03F 3/45 (2006.01)
H03M 1/06 (2006.01)
H03M 1/52 (2006.01)

(52) U.S. Cl.
CPC ...... *H03M 1/0663* (2013.01); *H03F 2200/261* (2013.01); *H03F 2200/264* (2013.01); *H03F 2200/78* (2013.01); *H03F 2203/45138* (2013.01); *H03M 1/52* (2013.01)

(56) References Cited

U.S. PATENT DOCUMENTS

| 2008/0211574 | A1 | 9/2008 | Denison |
| 2009/0309653 | A1* | 12/2009 | Luff .................................. 330/9 |
| 2011/0068861 | A1 | 3/2011 | Denison |

FOREIGN PATENT DOCUMENTS

| CN | 100486111 | 5/2009 |
| JP | 09-166631 | 6/1997 |
| WO | 2008/094269 | 8/2008 |
| WO | 2008/094271 | 8/2008 |

OTHER PUBLICATIONS

Luc G Fasoli et al:"A General circuit for Resistive Bridge sensors with Bitstream Outpu" IEEE Transactions on Instrumentation and Measurement, IEE Service Center, Psicataway, NJ, US, vol. 46, No. 4, Aug. 1, 1997, pp. 954-960.*

A.R. Owens, "Digital signal conditioning and conversion", J. Phys. E. Scientific. Instruments. vol. 15, Aug. 1, 1982, pp. 789-806.

Luca G. Fasoli et al., "A General Circuit for Resistive Bridge Sensors with Bitstream Output", IEEE Transactions on Instrumentation and Measurement vol. 46, No. 4, Aug. 1, 1997, pp. 954-960.

J.V. Moskaitis et al., "A microprocessor-based technique for transducer linearization", Precision Engineering vol. 5, No. 1, Jan. 1, 1983, pp. 5-8.

L.T. Li et al., "Design and implementation of a system with a multielement thermopile for monitoring temperature of a plane", Review of Scientific Instruments, vol. 80, No. 4, Apr. 28, 2009, pp. 45111-1-45111-8.

Qi Jia et al., "A Precision Integrated Interface Circuit for Thermopile Based Sensors", IEEE International Instrumentation and Measurement Technology Conference Proceedings, May 12-15, 2008, pp. 1623-1626.

Roger Diels, "Reliable, High Quality Infrared Sensors Have Found Their Way Into Automotive Climate Control", Melexis Product Sheet, circa 2010, pp. 1-16. (http://www.melexis.com/Assets/Reliable_High_Quality_Infrared_Sensors_In_Automotive_Climate_Control_3810.aspx).

A. Bakker et al., "A CMOS Chopper Opamp with Integrated Low-Pass Filter", Proceedings of the 23rd European Solid-State Circuits Conference, 1997, pp. 1-4, ESS Cir '97.

International Search Report, dated Feb. 17, 2011, for corresponding International Patent Application No. PCT/JP2010/064852.

China Office Action, mailed Feb. 25, 2014, for corresponding Chinese Patent Application No. 201080037797.2 (together with a partial English language translation thereof).

* cited by examiner

SENSOR DEVICE

TECHNICAL FIELD

The present invention relates to a sensor device for detecting a physical quantity.

BACKGROUND ART

Conventionally, there has been known a sensor device with a sensor unit for converting a physical quantity into an electrical quantity. The sensor unit is, for example, a thermocouple. The thermocouple measures the temperature of an object by absorbing infrared rays radiated from the object.

The thermocouple indicates a temperature change amount in the form of a voltage signal. For example, if the temperature change amount is 1 degree, it is indicated in the form of a voltage signal with a voltage value of 2.3 µV.

Since a temperature change amount is indicated in the form of a voltage signal with a small voltage value, this voltage signal needs to be amplified with a high gain in order to accurately measure the temperature of an object using this voltage signal.

Accordingly, a sensor device conventionally includes an amplifier. The amplifier has a function of receiving a voltage signal from a sensor unit such as a thermocouple and amplifying this voltage signal. However, an output from the amplifier is likely to be contaminated with an offset voltage and low-frequency 1/f noise inherent in the amplifier.

Chopping technology is widely known as technology for efficiently removing an offset voltage and low-frequency 1/f noise inherent in an amplifier. This is technology for separating offset voltage and 1/f noise parts mixed during an amplification process by the amplifier from a voltage signal. The chopping technology is, for example, disclosed in patent literatures 1 and 2 below.

Literature 1 is "Reliable High Quality Infrared Sensors have Found Their Way Into Automotive Climate Control" by Roger Diels, Melexis Product Sheet, http://www.melexis.com/Assets/Reliable_High_Quality_Infrared_Sensors_In_Automotive_Climate_Control_3810.aspx.

Literature 2 is "A CMOS Chopper Opamp with Integrated Low-Pass Filter" by A. Bakker and J. H. Huijsing, Proceedings of the 23$^{rd}$ European Solid-State Circuits Conference, 1997 ESS CIRC' 97.

The chopping technology is specifically described. Frequencies of offset voltage and 1/f noise parts are converted into a chopping frequency and its odd number multiples, whereas the frequency of a voltage signal part indicating a temperature change is converted into a frequency in a low frequency band and even number multiples of Pre chopping frequency. In this way, the offset voltage and 1/f noise parts having the chopping frequency and its odd number multiples could be removed by a low-pass filter.

SUMMARY OF THE INVENTION

It has the following problems to remove only the offset voltage and 1/f noise parts having the chopping frequency and its odd number multiples by the low-pass filter and take out only the voltage signal part indicating the temperature change and lying in the low frequency band.

The offset voltage and 1/f noise mixed during the amplification process are present in a very low frequency band. The offset voltage and 1/f noise present in such a frequency band are processed to have the chopping frequency and its odd number multiples by the chopping technology. The voltage signal part indicating the temperature change is processed to have the frequency in the low frequency band.

A low-pass filter having a low cutoff frequency is necessary to accurately take out only the voltage signal part indicating the temperature change. The cutoff frequency of the low-pass filter is expressed by $1/(2\pi RC)$ where R denotes a resistance value and C denotes a capacitance.

In order to enable the low-pass filter to have a low cutoff frequency, a time constant expressed by RC needs to be large. Accordingly, either one of the resistance value and the capacitance needs to be large.

Generally, constituent elements for chopping and a low-pass filter are mounted on a monolithic integrated circuit. However, if, for example, the number of resistors is increased or a larger capacitor is used to increase the time constant of the low-pass filter, the circuit size of the low-pass filter increases. As a result, the circuit size of the sensor device increases.

In order to more accurately measure the temperature of an object, a digital converter may be provided to convert a voltage signal component having passed through the low-pass filter into a digital signal. Since the digital converter is composed of a multitude of constituent elements, the circuit size of the sensor device further increases.

In order to solve the above problems, an object of the present invention is to provide a sensor device capable of digital conversion while removing noise components mixed during an amplification process without increasing a circuit size.

One aspect of the present invention is directed to a sensor device, comprising a voltage detection type sensor unit for converting a physical quantity into a voltage value and outputting a voltage signal indicating the voltage value; a chopper amplifier unit for generating a modulation signal by chopping the voltage signal output from the sensor unit with a predetermined chopping frequency, amplifying the modulation signal into an amplification signal, then demodulating the amplification signal and outputting it as an output signal; an integration unit including an operational amplifier for amplifying a voltage difference between a voltage at a non-inverting input terminal and a voltage at an inverting input terminal, an input resistor connected to the inverting input terminal of the operational amplifier and a capacitor connected between the inverting input terminal and an output terminal of the operational amplifier and adapted to sample the output signal output from the chopper amplifier unit at a predetermined sampling frequency and integrate the sampled output signal; and a digital conversion unit for converting the output signal integrated by the integration unit into a digital signal.

DESCRIPTION OF EMBODIMENTS

Figure 1:
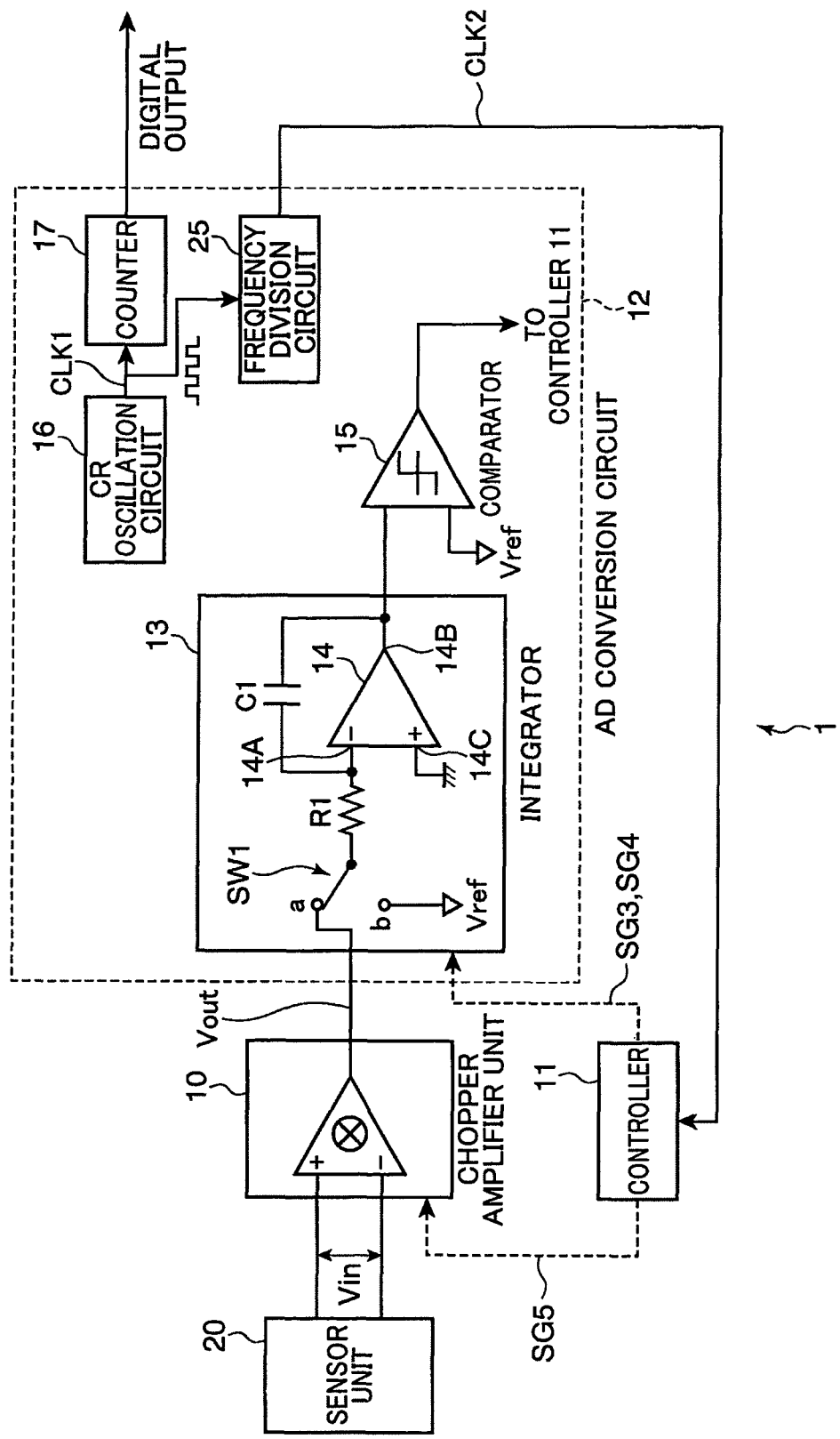
FIG. 1 is a diagram showing an exemplary construction of a sensor device according to one embodiment of the invention.
Figure 2:
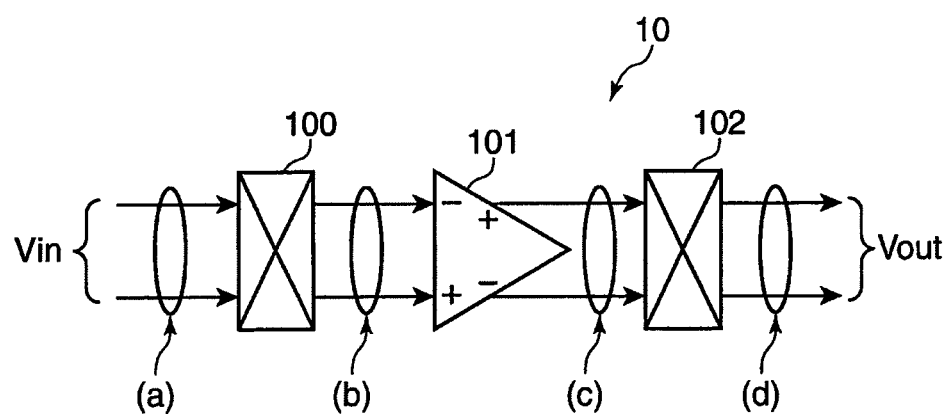
FIG. 2 is a diagram showing an exemplary construction of a chopper amplifier unit.
Figure 3:
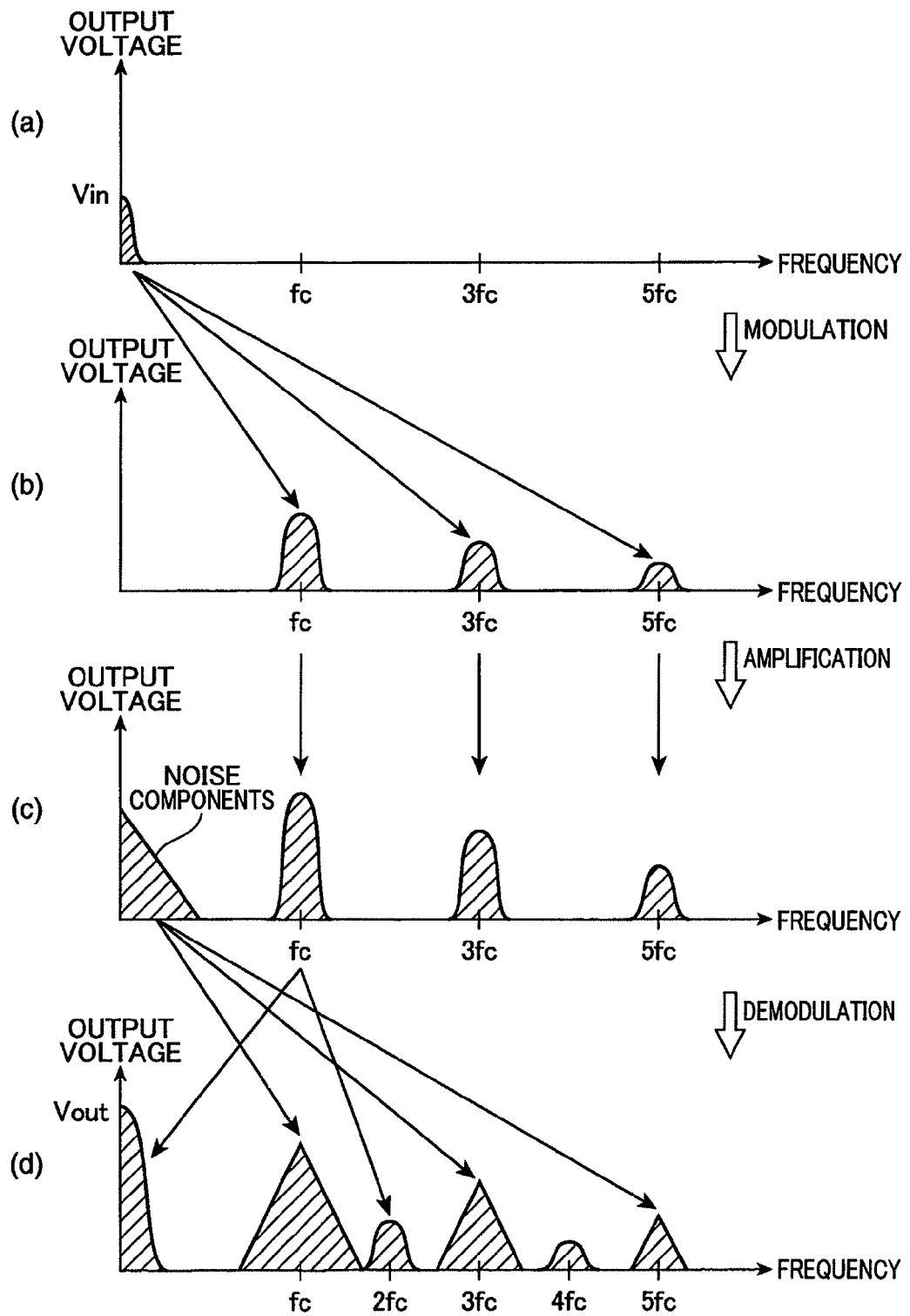
FIG. 3 shows graphs showing an exemplary operation of the chopper amplifier unit.
Figure 4:
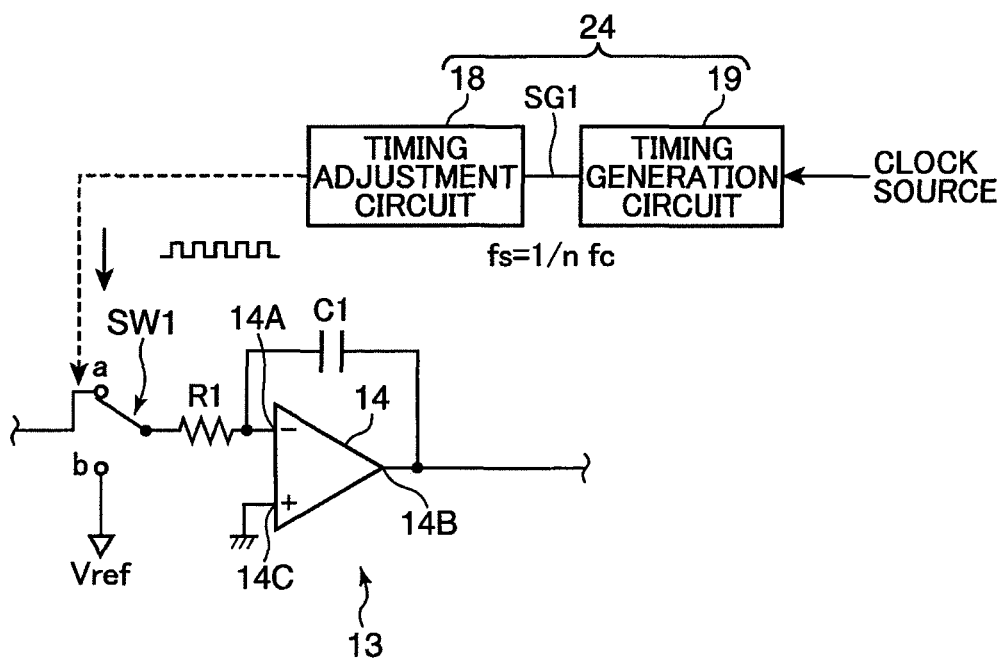
FIG. 4 is a diagram showing an exemplary construction of an integrator.

A sensor device according to one embodiment of the present invention is described below. FIG. 1 is a diagram showing an exemplary construction of the sensor device. FIG. 2 is a diagram showing an exemplary construction of a chopper amplifier unit. FIG. 3 shows graphs showing an exemplary operation of the chopper amplifier unit. FIG. 4 is a diagram showing an exemplary construction of an integrator.

The sensor device 1 shown in FIG. 1 includes a controller (control unit) 11. The controller 11 centrally controls respective constituent elements described below. The sensor device 1 further includes a voltage detection type sensor unit 20, a chopper amplifier unit 10 and an AD conversion circuit (digital conversion unit) 12. The sensor unit 20 converts a physical quantity into a voltage value and outputs a voltage signal indicating this voltage value.

The chopper amplifier unit 10 includes a first chopper circuit 100, an operational amplifier 101 and a second chopper circuit 102. The chopper amplifier unit 10 operates, for example, as shown in FIG. 3.

In the chopper amplifier unit 10, the first chopper circuit 100 receives an input of a voltage signal Vin output from the sensor unit 20 (see FIG. 1). A graph (a) shown in FIG. 3 shows an exemplary frequency characteristic of the sensor unit 20. The sensor unit 20 outputs the voltage signal Vin indicating a detected temperature change in the form of a voltage signal to the first chopper circuit 100. Such a voltage signal Vin is a signal having a frequency in a frequency band lower than a chopping frequency fc in the graph (a). Then, the first chopper circuit 100 modulates the voltage signal Vin received from the sensor unit 20 by chopping it with the predetermined chopping frequency fc.

A graph (b) shown in FIG. 3 shows an exemplary frequency characteristic of the first chopper circuit 100. The first chopper circuit 100 chops the voltage signal Vin with the chopping frequency fc upon receiving the voltage signal Vin output from the sensor unit 20. As a result, the voltage signal Vin is modulated into voltage signals having the chopping frequency fc and its odd number multiples as shown in the graph (b).

Here, in the graph (b), voltage values of the voltage signals Vin having the frequencies that are odd number multiples of the chopping frequency fc are smaller than a voltage value of the voltage signal Vin having the chopping frequency fc, and the voltage value of the voltage signal Vin decreases as the odd number multiple of the chopping frequency fc increases. This is for the following reason.

A rectangular wave having the chopping frequency fc is used to modulate a signal having a certain frequency by chopping it with the chopping frequency fc. The rectangular wave is composed of a fundamental wave having the chopping frequency fc as a basic frequency and harmonics having frequencies that are predetermined number of times higher than the basic frequency (chopping frequency fc). A frequency spectrum in which harmonics are present at frequencies that are odd number times higher than the basic frequency (chopping frequency fc) is obtained as a frequency spectrum of such a rectangular wave, for example, when the duty ratio of the rectangular wave is 50%.

In the frequency spectrum of the rectangular wave, it is known that the value of the harmonic decreases as the frequency thereof increases. Accordingly, in the frequency spectrum of the rectangular wave, the value of the harmonic decreases as the odd number multiple increases from the basic frequency (chopping frequency fc).

When the voltage signal Vin is modulated using such a rectangular wave, a signal having such a waveform obtained as if by superimposing the rectangular wave on the voltage signal Vin is obtained. As a result, components of the chopping frequency fc and its odd number multiples in this signal are obtained as modulated voltage signals Vin.

Accordingly, the voltage values of the voltage signals Vin having the frequencies that are odd number times higher than the chopping frequency fc are smaller than the voltage value of the voltage signal Vin having the chopping frequency fc, and the voltage value of the voltage signal Vin decreases as the odd number multiple of the chopping frequency fc increases.

The operational amplifier 101 amplifies the voltage values of the modulated voltage signals Vin having the chopping frequency fc and its odd number multiples. In this amplification process, the voltage signals Vin are contaminated with an offset voltage and 1/f noise (hereinafter, referred to as noise components) inherent in the operational amplifier 101. Such noise components are generally located in a frequency band lower than the chopping frequency fc.

A graph (c) shown in FIG. 3 shows an exemplary frequency characteristic of the operational amplifier 101. The operational amplifier 101 amplifies the voltage signals Vin with a predetermined amplification factor when receiving the voltage signals Vin modulated to have the chopping frequency fc and its odd number multiples in the first chopper circuit 100. As a result, the voltage signals Vin modulated to have the chopping frequency fc and its odd number multiples are amplified. As shown in the graph (c), the voltage signals Vin are contaminated with noise components in the frequency band lower than the chopping frequency fc.

The second chopper circuit 102 demodulates an output signal of the operational amplifier 101 and outputs it as an output signal Vout. A graph (d) shown in FIG. 3 shows an exemplary frequency characteristic of the second chopper circuit 102. As shown in the graph (d), the voltage signal Vii amplified by the operational amplifier 101 comes to have the same frequency as the one at the time of output from the sensor unit 20 by the demodulation by the second chopper circuit 102.

On the other hand, the noise components in the low frequency band mixed during the amplification process by the operational amplifier 101 come to have the chopping frequency fc and its odd number multiples by the demodulation by the second chopper circuit 102.

Next, the AD conversion circuit 12 is described. The AD conversion circuit 12 is composed of a so-called double integration type A/D converter. The AD conversion circuit 12 includes an integrator (integration unit) 13, a comparator 15, a CR oscillation circuit (oscillation unit) 16 and a counter 17.

As shown in FIGS. 1 and 4, the integrator 13 includes an operational amplifier 14, an input resistor 14 and a capacitor C1. The input resistor R1 is connected to an inverting input terminal 14A of the operational amplifier 14. The capacitor C1 is connected between the inverting input terminal 14A and an output terminal 14B of the operational amplifier 14. In the operational amplifier 14, a non-inverting input terminal 14C is grounded.

A switch SW1 is provided at the other end of the input resistor R1. The other end of the resistor R1 is switchingly connected with either one of terminals "a" and "b" by the switch SW1. The terminal "a" is connected to the chopper amplifier unit 10. A reference voltage Vref is applied to the terminal "b". The switch SW1 is controlled by the controller 11.

An integration process in the integrator 13 is outlined below. First of all, with the switch SW1 connected with the terminal "a", the integration of the output signal Vout output from the chopper amplifier unit 10 is started. At this time, the capacitor C1 is charged with the output signal Vout. The integrator 13 maintains this state for a predetermined period (hereinafter, referred to as a sampling period). The sampling period is a period during which the switch SW1 is connected with the terminal "a", and can also be called a sampling time. Since the output signal Vout output from the chopper amplifier unit 10 is input to the inverting input terminal 14A during the sampling period, a voltage of an output signal from the integrator 13 decreases.

Upon the lapse of the sampling period after the charging of the capacitor C1 is started, the controller 11 causes the switch SW1 to be connected with the terminal "b" and the counter 17 to start counting clock pulses CLK1. In this way, the reference voltage Vref (voltage having a polarity opposite to that of the output signal Vout) is applied to the other end of the input resistor R1. Since this causes the capacitor C1 to start discharging, the output voltage of the integrator 13 increases. When the output voltage of the integrator 13 reaches a certain voltage (e.g. reference voltage Vref), the controller 11 causes the switch SW1 to be located at a position where it is connected with neither of the terminals "a" and "b" and stops counting of the clock pulses CLK1 by the counter 17. In this way, the integration process by the integrator 13 is completed.

The operational amplifier 14 of the integrator 13 has a property of decreasing an amplification factor as the frequency of an input signal increases when the frequency of this signal exceeds a predetermined frequency. Thus, the integrator 13 can have a function of decreasing the amplification factor as the frequency increases when the frequency of the output signal Vout input to the integrator 13 exceeds a predetermined frequency (e.g. frequency that is 1.5 times higher than a sampling frequency). Accordingly, the passage of the input signal is possible if the frequency thereof is below the predetermined frequency, whereas the passage of the input signal becomes more difficult as the frequency thereof increases beyond the predetermined frequency. In other words, the integrator 13 functions as a low-pass filter.

Whether or not the output signal from the integrator 13 has reached the predetermined voltage (e.g. reference voltage Vref) is judged utilizing the comparator 15. The comparator 15 compares the voltage value of the output signal from the integrator 13 and the reference voltage Vref. The controller 11 monitors whether or not the output voltage of the integrator 13 has reached the predetermined voltage (e.g. reference voltage Vref). When the output voltage of the integrator 13 reaches the predetermined voltage, the controller 11 terminates the integration process by the integrator 13.

The counter 17 counts a pulse number of the clock pulses CLK1 until the output signal of the integrator 13 reaches the predetermined voltage (reference voltage Vref) after the capacitor C1 started discharging. The pulse number counted by the counter 17 is in proportion to the voltage value of the voltage signal input to the integrator 13. In this way, the pulse number counted by the counter 17 is output as a digital signal indicating a temperature change to a circuit at a subsequent stage.

Main effects of this embodiment are described.

The operational amplifier has a property of decreasing an amplification factor as the frequency of an input signal increases when the frequency of this signal exceeds a predetermined frequency. Accordingly, the integrator 13 can have a function of decreasing the amplification factor as the frequency of the received output signal increases when the frequency of this signal exceeds the predetermined frequency. Thus, the integrator 13 allows the input signal to pass if the frequency of this signal is below the predetermined frequency while making the passage of the input signal more difficult as the frequency of this signal increases beyond the predetermined frequency.

Since the integrator 13 performs the function of the low-pass filter in this way, it is not necessary to separately provide a low-pass filter. Further, an integral value by the integrator 13 is converted into a digital signal by the AD conversion circuit 12. As described above, according to this embodiment, digital conversion is possible by removing noise components mixed during an amplification process without increasing the circuit size of the sensor device 1.

The CR oscillation circuit 16 is an oscillator including a capacitor and a resistor. This RC oscillation circuit 16 generates the clock pulses CLK1 used to operate the chopper amplifier unit 10 and the integrator 13. Although the CR oscillation circuit 16 is provided in the AD conversion circuit 12 in FIG. 1, it may be provided independently of the AD conversion circuit 12.

The counter 17 counts the number of the clock pulses CLK1 output from the CR oscillation circuit 16 during a predetermined period. The predetermined period is a period until the voltage of the output signal of the integrator 13 reaches the reference voltage Vref after the discharging of the capacitor C1 is started by the control of the controller 11. The count value is output as a digital signal to the circuit at the subsequent stage. In this way, a digital signal having a value corresponding to a charged electricity amount of the capacitor C1 is output. Here, the capacitor and the resistor of the CR oscillation circuit 16 have the same temperature characteristics as the input resistor R1 and the capacitor C1 of the integrator 13. The capacitor and the resistor of the CR oscillation circuit 16 have the same electrical characteristics as the input resistor R1 and the capacitor C1 of the integrator 13.

Since the AD conversion circuit 12 is constructed as described above, the voltage signal output from the chopper amplifier unit 10 is integrated in the integrator 13 and a digital signal having a value corresponding to the integral value is output.

As shown in FIG. 4, the sensor device 1 includes a pulse width adjustment circuit 24. The pulse width adjustment circuit 24 is provided, for example, in the controller 11. The clock pulses CLK1 output from the CR oscillation circuit 16 are frequency-divided into clock pulses CLK2 by a frequency division circuit 25 shown in FIG. 1. The pulse width adjustment circuit 24 performs a predetermined processing (not shown) upon receiving the clock pulses CLK2, thereby adjusting a frequency of connecting the switch SW1 of the integrator 13 with the terminal "a". In this way, the pulse width adjustment circuit 24 functions as a sampling frequency adjuster, i.e. adjusts the frequency of connecting the switch SW1 with the terminal "a", thereby having a function of adjusting a sampling frequency indicating a frequency of the integrator 13 to sample the output signal Vout from the chopper amplifier unit 10.

In this way, the sampling frequency at which the integrator 13 samples the output signal Vout from the chopper amplifier unit 10 can be adjusted by the pulse width adjustment circuit 24. Thus, the sensor device 1 according to this embodiment has the following advantages.

Figure 5:
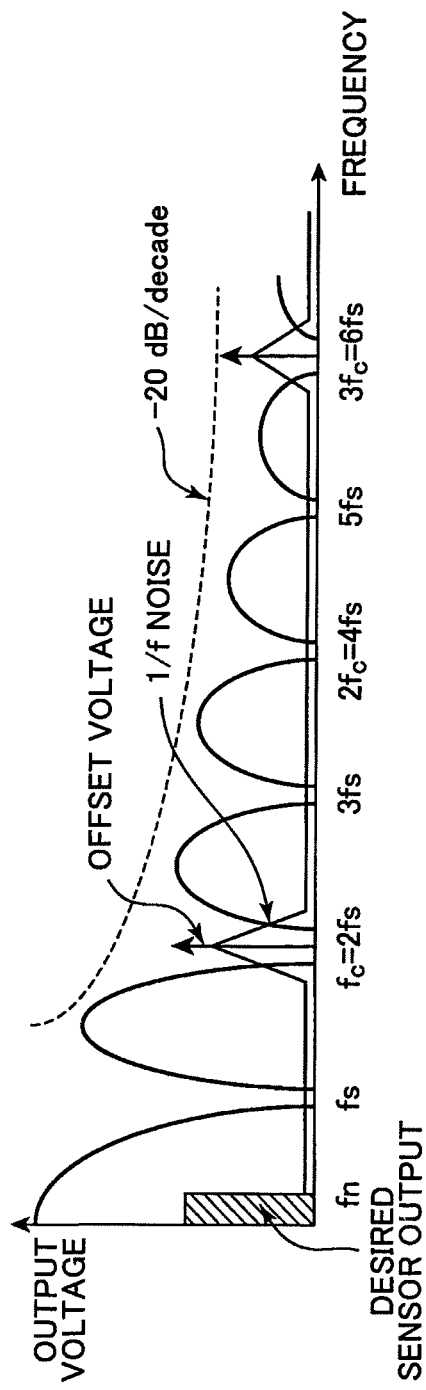
FIG. 5 is a graph showing exemplary frequency characteristics of the chopper amplifier unit and the integrator.

As described above, in the integrator 13, the amplification factor decreases as the frequency of the received output signal Vout increases when the frequency of this signal exceeds the predetermined frequency. The frequency at or above which the amplification factor decreases is determined by the magnitude of the sampling frequency (see FIG. 5). A horizontal axis represents the frequency of the output signal Vout input to the integrator 13 and a vertical axis represents the voltage of the output signal output from the integrator 13. In FIG. 5, the predetermined frequency at or above which the amplification factor decreases is a frequency that is 1.5 times higher than the sampling frequency fs.

As a result, the integrator 13 functions as a low-pass filter which makes the passage of the output signal Vout input to the integrator 13 more difficult as the frequency of the output signal Vout increases beyond a certain frequency determined by the magnitude of the sampling frequency fs. Thus, the integrator 13 can make the passage of noise components having frequencies exceeding the certain frequency determined by the magnitude of the sampling frequency fs difficult if the magnitude of the sampling frequency fs is determined.

In the sensor device 1 according to this embodiment, the sampling frequency fs at which the integrator 13 samples the received output signal Vout is adjusted by the pulse width adjustment circuit 24. Thus, out of noise components in a certain frequency band included in the output signal Vout input to the integrator 13, those that should be made difficult to pass the integrator 13 can be adjusted. Thus, out of noise components in a certain frequency band mixed in the output signal trying to pass the integrator 13, those having frequencies exceeding the certain frequency determined by the magnitude of the sampling frequency fs are removed. As a result, a ratio of noise components to the signal passing the integrator 13 can be adjusted.

The pulse width adjustment circuit 24 includes a timing generation circuit 19 and a timing adjustment circuit 18. The timing generation circuit 19 generates a reference signal SG1 by frequency-dividing the clock pulses CLK2 obtained by frequency-dividing the clock pulses CLK1 output from a clock source (CR oscillation circuit 16 in this embodiment). The timing adjustment circuit 18 adjusts the duration of the sampling period indicated by a pulse width of the reference signal SG1 by adjusting this pulse width. The reference signal SG1 is a reference signal having a pulse width indicating a sampling reference period used as a basis when the duration of the sampling period is adjusted.

The timing adjustment circuit 18 also extends the sampling period by increasing the pulse width of the reference signal SG1 and shortens the sampling period by reducing the pulse width. In this way, the pulse width adjustment circuit 24 adjusts the sampling frequency fs expressed by an inverse of the sampling period by adjusting the sampling period.

In the sensor device 1 constructed as described above, the chopping cycle expressed by an inverse of the chopping frequency and the sampling cycle expressed by an inverse of the sampling frequency fs are synchronized.

The chopping frequency fc is an n-fold of the sampling frequency fs (where n is a natural number equal to or greater than 1). A relationship of these chopping frequency fc and sampling frequency fs is realized, for example, by the adjustment of the sampling frequency fs by the pulse width adjustment circuit 24. The chopping frequency fc is twice as high as the sampling frequency fs in FIG. 5.

Since the chopping frequency fc and the sampling frequency fs have such a relationship, the following functions and effects are achieved.

FIG. 5 is a graph showing exemplary frequency characteristics of the chopper amplifier unit 10 and the integrator 13. In FIG. 5, a hatched area is a sensor output at frequencies in a range of 0 to fn, and this sensor output is an output to be reflected as a digital output.

In FIG. 5, noise components present in a low frequency band are those caused to have the chopping frequency fc and its odd number multiples by the chopper amplifier unit 10.

A frequency response of the integrator 13 is such that the voltage value of the signal output from the integrator 13 decreases from a predetermined voltage value Vint to 0 when the frequency of the output signal input to the integrator 13 increases from 0 to the sampling frequency fs. Thereafter, every time the frequency of the output signal input to the integrator 13 becomes two or greater natural number times as high as the sampling frequency fs, the voltage value of the signal output from the integrator 13 becomes 0. The frequency response described above is also disclosed, for example, in the above patent literature 2.

The frequency response of the integrator 13 is, due to the characteristic of the operational amplifier 14, such that the amplification factor becomes 1/10 every time the frequency of the input signal becomes ten times higher when the frequency of this signal exceeds the predetermined frequency (frequency that is 1.5 times higher than the sampling frequency fs). In FIG. 5, this is shown by "−20 dB/decade".

According to the sensor device 1 of this embodiment, the chopping cycle and the sampling cycle are synchronized and the chopping frequency is an n-fold of the sampling frequency (wherein n is a natural number equal to or greater than 1) as described above. Thus, the chopping frequency fc and its odd number multiples coincide with the sampling frequency fs and its multiples at which the voltage value of the output signal output from the integrator 13 becomes 0.

Thus, even if the voltage signal having the chopping frequency fc or its odd number multiple is input to the integrator 13, the voltage value of the output signal output from the integrator 13 becomes 0. Thus, noise components mixed in a voltage signal having the chopping frequency fc or its odd number multiple are not reflected on the output signal from the integrator 13. As a result, noise components mixed in the voltage signal from the sensor unit 20 can be accurately removed.

Here, one of features of this embodiment is described anew. The integrator 13 includes the switch SW1, thereby having a function as a sampling filter. The sampling filter can adjust a cutoff frequency according to a sampling frequency. In this embodiment, noise components having high frequencies and included in an output signal output from the chopper amplifier unit 10 are removed by adjusting the sampling frequency, i.e. sampling cycle of the integrator 13. Further, in this embodiment, a signal which will become a basis for a digital signal is generated utilizing electric charges charged in the capacitor C1 of the integrator 13 during the predetermined sampling period. In other words, an output signal integrated by the integrator 13 is generated by causing the capacitor C1 of the integrator 13 to discharge after the lapse of the sampling period. The above operation is controlled by the controller 11.

Figure 7:
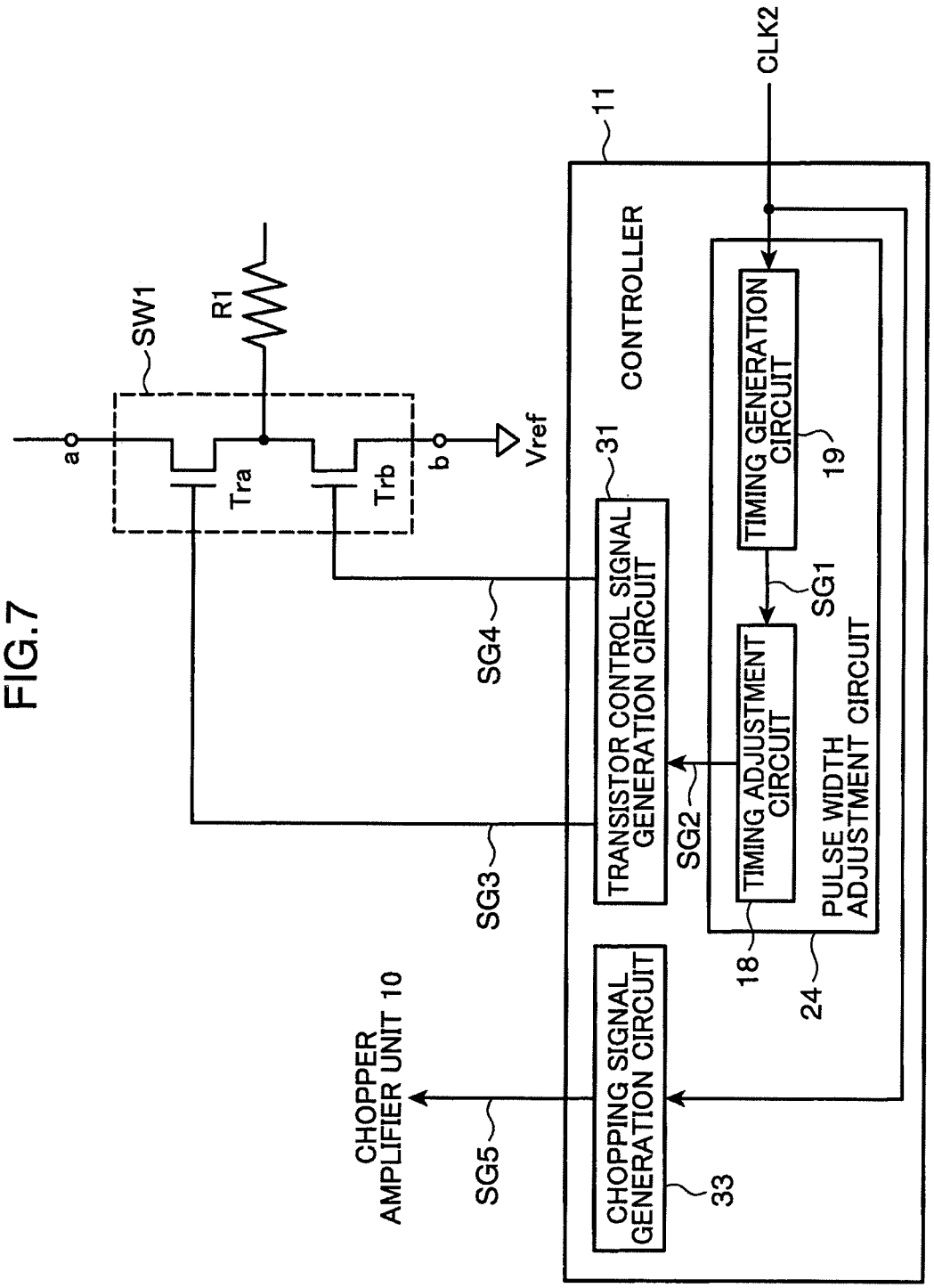
FIG. 7 is a functional block diagram of an exemplary controller.
Figure 8:
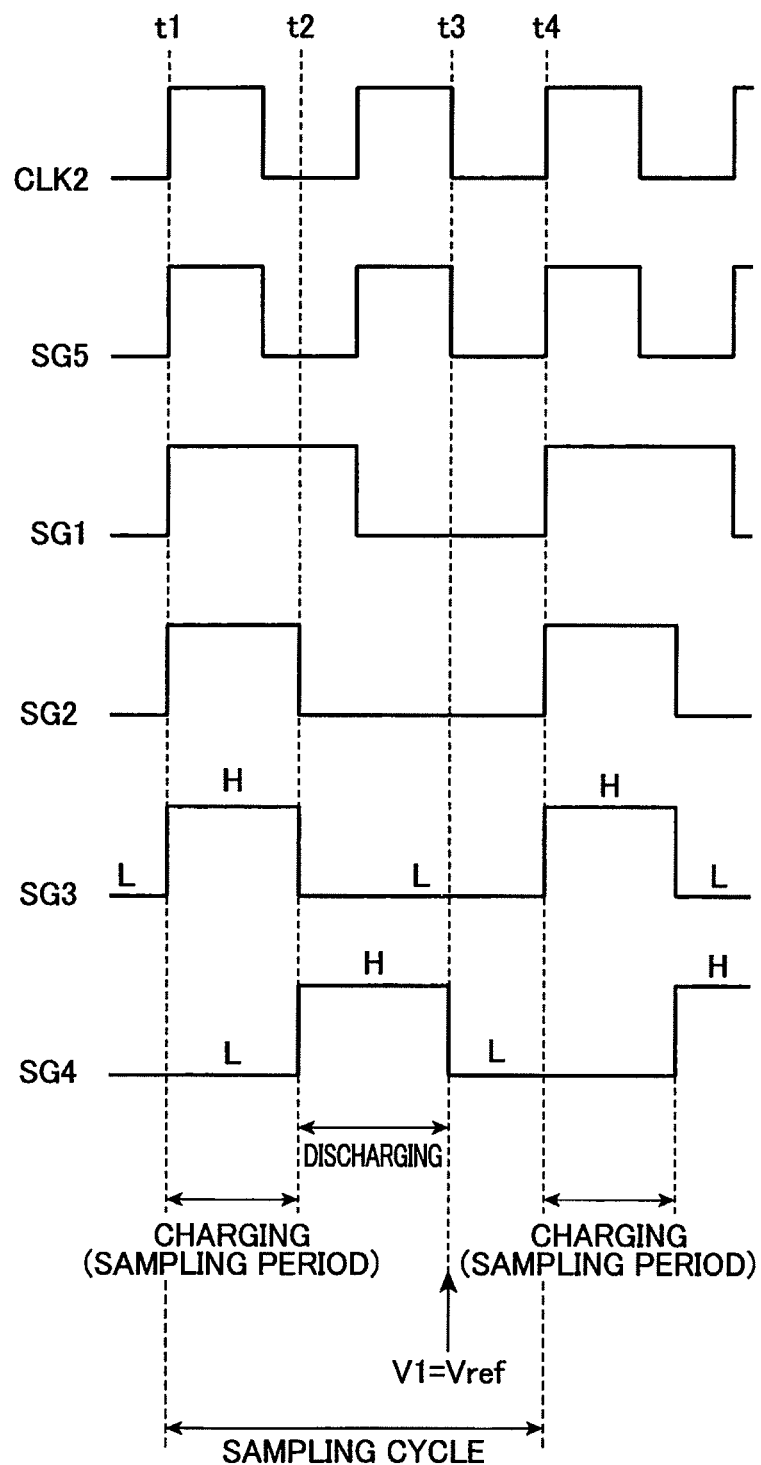
FIG. 8 is a timing chart showing an exemplary operation of the controller.

The controller 11 is summarized as follows. FIG. 7 is a functional block diagram of an example of the controller 11. FIG. 8 is a timing chart showing an exemplary operation of the controller 11. The controller 11 has a function as an integration control unit and includes a pulse width adjustment circuit 24, a transistor control signal generation circuit 31 and a chopping signal generation circuit 33.

The pulse width adjustment circuit 24 includes a timing generation circuit 19 and a timing adjustment circuit 18. The timing generation circuit 19 generates a reference signal SG1 by frequency-dividing clock pulses CLK2 output from the circuit division circuit 25 shown in FIG. 1. The timing adjustment circuit 18 adjusts the duration of a sampling period indicated by a pulse width of the reference signal SG1 by adjusting this pulse width. The signal output from the timing adjustment circuit 18 is a pulse signal having the sampling frequency and called a sampling signal SG2.

The transistor control signal generation circuit 31 generates a control signal SG3 for a transistor Tra and a control signal SG4 for a transistor Trb based on the sampling signal SG2. The switch SW1 shown in FIG. 1 is constructed by the transistors Tra and Trb.

The terminal "a" and the input resistor R1 are connected by turning the transistor Tra on while being disconnected by turning the transistor Tra off. In contrast, the terminal "b" and the input resistor R1 are connected by turning the transistor Trb on while being disconnected by turning the transistor Trb off.

The control signal SG3 for the transistor Tra switches a state of the transistor Tra from an off-state to an on-state by being switched from low to high when the sampling signal SG2 rises (time t1) as shown in FIG. 8. In this way, the terminal "a" and the input resistor R1 are connected to charge the capacitor C1. Since the control signal SG4 for the transistor Trb is low at time t1, the transistor Trb is kept off. Accordingly, the terminal "b" and the input resistor R1 are disconnected. At time t1, the charging of the capacitor C1 is started, thereby starting the sampling period. In this way, the output signal Vout output from the chopper amplifier unit 10 is input to the inverting input terminal 14A shown in FIG. 1.

The operational amplifier 14 has a property of decreasing the amplification factor as the frequency of the input signal increases when the frequency of this signal exceeds a predetermined value. In this embodiment, the operational amplifier 14 functions as a low-pass filter utilizing this property thereof. Accordingly, during the sampling period, the capacitor C1 is charged with the signal obtained by removing noise components having high frequencies from the output signal output from the integrator 13.

The sampling period ends when the sampling signal SG2 falls (time t2). At time t2, the control signal SG3 for the transistor Tra is switched from high to low and the control signal SG4 for the transistor Trb switches from low to high. Thus, the transistor Tra is switched from the on-state to the off-state and the transistor Trb is switched from the off-state to the on-state. Therefore, the terminal "a" and the input resistor R1 are disconnected and the terminal "b" and the input resistor R1 are connected, whereby the capacitor C1 starts discharging.

The counter 17 shown in FIG. 1 counts the number of clock pulses CLK1 until a voltage V1 of the output signal of the integrator 13 reaches the reference voltage Vref after the discharging of the capacitor C1 is started. Whether or not the voltage V1 has reached the reference voltage Vref is judged by the comparator 15. The pulse number counted by the counter 17 is in proportion to the voltage value of the voltage signal Vout input to the integrator 13. The pulse number counted by the counter 17 is output as a digital signal indicating a temperature change to a circuit at a subsequent stage.

It is assumed that the voltage V1 of the output signal from the integrator 13 increases and reaches the same value as the reference voltage Vref at time t3. At time t3, the controller 11 switches the state of the transistor Trb from the on-state to the off-state by switching the control signal SG4 for the transistor Trb from high to low. Thus, the input resistor R1 comes to be connected with neither of the terminals "a" and "b".

At time t4, the sampling signal SG2 rises, whereby the control signal SG3 for the transistor Tra switches from low to high and the charging of the capacitor C1 is started. Temperature is calculated based on a digital output obtained by repeating the above operations.

The temperature is calculated by a time meter of the AD conversion circuit 12. The time meter measures a time until the integration process is completed after the lapse of the sampling period in a digital value and the time measured in the digital value is output as a digital signal.

On the other hand, the chopping signal generation circuit 33 shown in FIG. 7 generates a chopping signal SG5 used for chopping based on the clock pulses CLK2 from the frequency division circuit 25. In this embodiment, the clock pulses CLK2 are directly used as the chopping signal SG5. Since the chopping signal SG5 and the sampling signal SG2 are generated based on the clock pulses CLK2, they can be synchronized.

Next, the CR oscillation circuit (oscillation unit) 16 shown in FIG. 1 is described.

The CR oscillation circuit 16 is composed of the resistor and the capacitor and generates the clock pulses CLK1 used to operate the chopper amplifier unit 10 and the integrator 13. The CR oscillation circuit 16 outputs the clock pulses CLK1 one cycle of which is a time constant of CR. The resistor and the capacitor of the CR oscillation circuit 16 have the same temperature characteristics as the input resistor R1 and the capacitor C1 of the integrator 13.

When an oscillation cycle of the CR oscillation circuit 16 (cycle of the clock pulses CLK1) becomes longer by being influenced by temperature, the pulse width of the sampling signal SG2 becomes longer, wherefore the sampling period becomes longer. Since this causes a charging time of the capacitor C1 to become longer, the amplification factor of the integrator 13 increases.

The amplification factor in the integrator 13 which operates on pulses by the CR oscillation circuit 16 is determined by a ratio of a resistance value of the resistor of the CR oscillation circuit 16 to that of the input resistor R1 of the integrator 13. The amplification factor in the integrator 13 is also determined by a ratio of a capacitance of the capacitor of the CR oscillation circuit 16 to that of the capacitor C1 of the integrator 13.

The resistor and the capacitor of the CR oscillation circuit 16 have the same temperature characteristics as the input resistor R1 and the capacitor C1 of the integrator 13. Thus, when an internal temperature of the sensor device 1 changes, the resistance values of the CR oscillation circuit 16 and the integrator 13 change by the same amount and the capacitances of the CR oscillation circuit 16 and the integrator 13 change by the same amount.

As a result, even if the internal temperature of the sensor device 1 changes, the ratio of the resistance value of the resistor of the CR oscillation circuit 16 to that of the input resistor R1 of the integrator 13 and the ratio of the capacitance of the capacitor of the CR oscillation circuit 16 to that of the capacitor C1 of the integrator 13 do not change. Thus, a change of the amplification factor in the integrator 13 can be suppressed when the internal temperature of the sensor device 1 changes.

The resistor and the capacitor of the CR oscillation circuit 16 have the same electrical characteristics as the input resistor R1 and the capacitor C1 of the integrator 13.

As described above, the amplification factor in the integrator 13 that operates on pulses by the CR oscillation circuit 16 is determined by the ratio of the resistance value of the resistor of the CR oscillation circuit 16 to that of the input resistor R1 of the integrator 13. The amplification factor in the integrator 13 is also determined by the ratio of the capacitance of the capacitor of the CR oscillation circuit 16 to that of the capacitor C1 of the integrator 13.

The resistor and the capacitor of the CR oscillation circuit 16 have the same electrical characteristics as the input resistor R1 and the capacitor C1 of the integrator 13. Here, a sheet resistance characteristic is cited as an example of the electrical characteristic.

Thus, when a process variation occurs during the manufacturing of the resistor of the CR oscillation circuit 16 and the input resistor R1 of the integrator 13, the resistance value of the resistor of the CR oscillation circuit 16 and that of the input resistor R1 of the integrator 13 change by the same amount since the resistor of the CR oscillation circuit 16 and the input resistor R1 of the integrator 13 have the same electrical characteristic. Thus, the ratio of the resistance value of the resistor of the CR oscillation circuit 16 to that of the input resistor RI of the integrator 13 does not change even if a process variation occurs during the manufacturing of the resistor of the CR oscillation circuit 16 and the input resistor R1 of the integrator 13.

Further, when a process variation occurs during the manufacturing of the capacitor of the CR oscillation circuit 16 and the capacitor C1 of the integrator 13, the capacitance of the capacitor of the CR oscillation circuit 16 and that of the capacitor C1 of the integrator 13 change by the same amount since the capacitor of the CR oscillation circuit 16 and the capacitor C1 of the integrator 13 have the same electrical characteristic. Thus, the ratio of the capacitance of the capacitor of the CR oscillation circuit 16 to that of the capacitor C1 of the integrator 13 does not change even if a process variation occurs during the manufacturing of the capacitor of the CR oscillation circuit 16 and the capacitor C1 of the integrator 13.

Accordingly, a change of the amplification factor in the integrator 13 can be suppressed even if a process variation occurs during the manufacturing of the resistor of the CR oscillation circuit 16 and the input resistor R1 of the integrator 13 or a process variation occurs during the manufacturing of the respective capacitors of the CR oscillation circuit 16 and the integrator 13.

Figure 6:
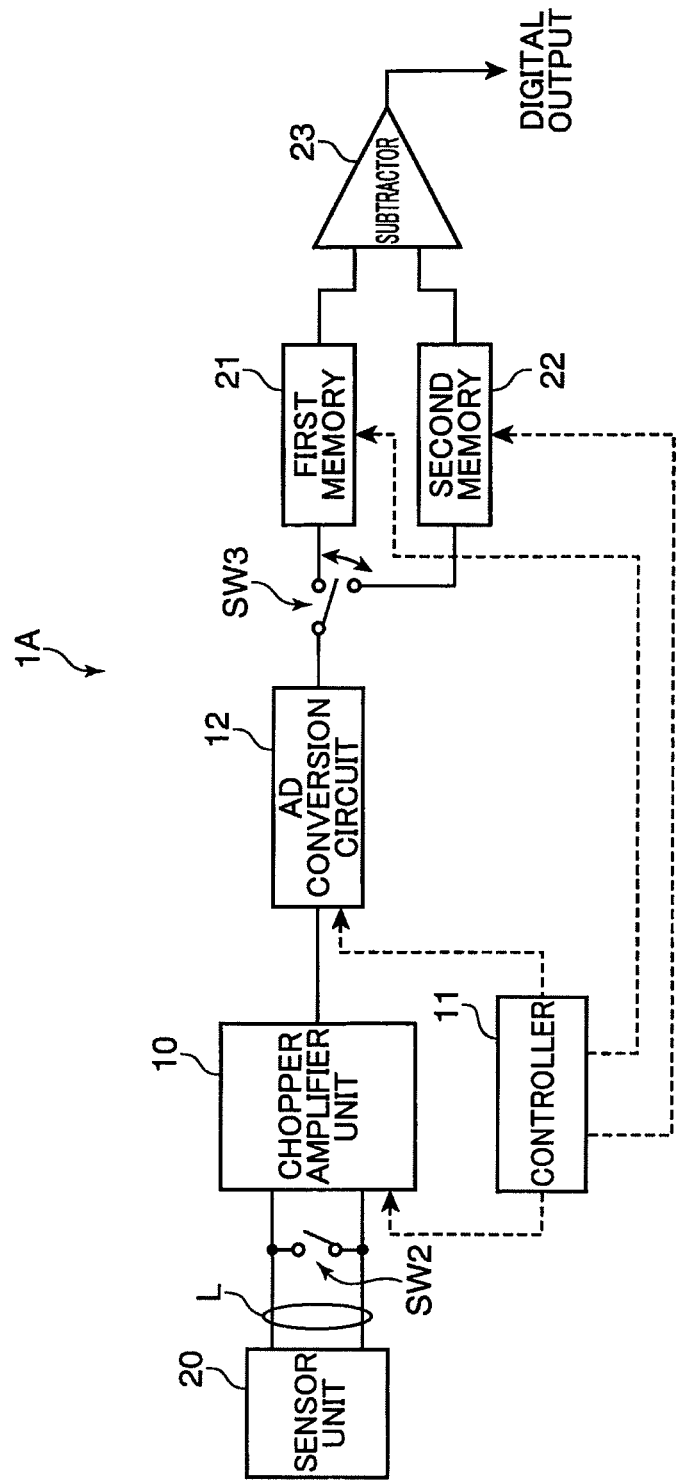
FIG. 6 is a diagram showing another exemplary construction of the sensor device according to the embodiment of the invention.

Next, another example of the construction of the sensor device according to the embodiment of the present invention is described. FIG. 6 is a diagram showing the other example. This sensor device 1A further includes a short-circuit switch SW2, a first memory 21, a second memory 22, a changeover switch SW3 and a subtractor 23. When the short-circuit switch (cutoff portion) SW2 is turned on, two signal lines L connecting a sensor unit 20 and a chopper amplifier unit 10 are short-circuited.

The first memory (first storage) 21 and the second memory (second storage) 22 are provided at a subsequent stage of an AD conversion circuit 12. The changeover switch (selector) SW3 selects in which of the first memory 21 and the second memory 22 a data of an output signal from the AD conversion circuit 12 is to be stored. The changeover switch SW3 switches connection of the AD conversion circuit 12 to the first memory 21 and the second memory 22.

At a subsequent stage of the first and second memories 21, 22 is provided the subtractor 23 for calculating a difference between a data of an output signal read from the first memory 21 and a data of an output signal read from the second memory 22.

In the sensor device 1A, a controller 11 (see FIG. 1) cuts off an output of a voltage signal from the sensor unit 20 to the chopper amplifier unit 10 by setting the short-circuit switch SW2 in a closed state. On the other hand, the controller 11 permits the voltage signal from the sensor unit 20 to be input to the chopper amplifier unit 10 by setting the short-circuit switch SW2 in an open state.

The controller (control unit) 11 connects the AD conversion circuit 12 to the first memory 21 by switching the changeover switch SW3 to the side of the first memory 21. On the other hand, the controller 11 connects the AD conversion circuit 12 to the second memory 22 by switching the changeover switch SW3 to the side of the second memory 22.

In the sensor device 1A thus constructed, the controller 11 causes a digital signal from the AD conversion circuit 12 to be stored in the first memory 21 with an output of a voltage signal from the sensor unit 20 to the chopper amplifier unit 10 cut off.

At this time, a voltage value expressed by the voltage signal input to the chopper amplifier unit 10 is determined by a voltage drop caused by an impedance inherent in the sensor unit 20 since the two signal lines L connecting the sensor unit 20 and the chopper amplifier unit 10 are short-circuited. Then, the voltage signal is input to the chopper amplifier unit 10 and noise components inherent in an operational amplifier 101 are mixed during an amplification process in the operational amplifier 101 of the chopper amplifier unit 10. Thus, an output signal from the chopper amplifier unit 10 is the one including noise components.

Then, the voltage signal including the noise components is input from the chopper amplifier unit 10 to the AD conversion circuit 12. Since the voltage signal including noise components is integrated by the integrator 13 in the AD conversion circuit 12, noise components inherent in not only the operational amplifier 101, but also an operational amplifier 14 of the integrator 13 are reflected on an integral value of the integrator 13. Thus, the noise components inherent in the operational amplifier 101 of the chopper amplifier unit 10 and the operational amplifier 14 of the integrator 13 are reflected in a digital signal from the AD conversion circuit 12.

Accordingly, a data of the digital signal stored in the first memory 21 with the voltage signal flowing from the sensor unit 20 to the chopper amplifier unit 10 cut off is a data of the digital signal reflecting the noise components inherent in the operational amplifier 101 of the chopper amplifier unit 10 and the operational amplifier 14 of the integrator 13.

On the other hand, the controller 11 causes the data of the digital signal from the AD conversion circuit 12 to be stored in the second memory 22 without the voltage signal flowing from the sensor unit 20 to the chopper amplifier unit 10 being cut off. In other words, the controller 11 causes the data of the digital signal from the AD conversion circuit 12 to be stored in the second memory 22 while setting the short-circuit switch SW2 in the open state so that the two signal lines L are not short-circuited.

At this time, since the voltage signal flowing from the sensor unit 20 to the chopper amplifier unit 10 is not cut off, the voltage signal including the noise components inherent in the operational amplifier 101 and indicating a temperature change is input from the chopper amplifier unit 10 to the AD conversion circuit 12.

Since the voltage signal including the noise components and indicating the temperature change is integrated by the integrator 13 in the AD conversion circuit 12, the integral value of the integrator 13 reflects the noise components inherent in the operational amplifier 101 and those inherent in the operational amplifier 14 of the integrator 13 in addition to the voltage signal indicating the temperature change. Thus, the digital signal from the AD conversion circuit 12 reflects the noise components inherent in the operational amplifier 101 of the chopper amplifier unit 10 and the operational amplifier 14 of the integrator 13 in addition to the voltage signal indicating the temperature change.

The controller 11 causes the subtractor 23 to calculate a difference between the data of the digital signal stored in the first memory 21 and that of the digital signal stored in the second memory 22. In this way, the digital signal indicating the noise components becomes 0 through subtraction and only the digital signal indicating the temperature change remains.

In the other example of this embodiment, the data of the output signal from the AD conversion circuit 12 is stored in the first memory 21 with the output of the voltage signal from the sensor unit 20 to the chopper amplifier unit 10 cut off. Further, the output signal from the AD conversion circuit 12 is stored in the second memory 22 without the output of the voltage signal from the sensor unit 20 to the chopper amplifier unit 10 being cut off. Then, the difference between the data of the output signal stored in the first memory 21 and that of the output signal stored in the second memory 22 is calculated.

In this way, the difference between the digital signal including the noise components and indicating the temperature change and the digital signal indicating only the noise components is calculated. Thus, the noise components inherent in the sensor device 1A can be removed from the digital signal indicating the temperature change, wherefore the temperature of an object can be more accurately measured.

Further, the controller 11 executes such a control that a data of an output signal converted into a digital signal in the AD conversion circuit 12 is stored more frequently in the second memory 22 than the data of the output signal is stored in the first memory 21.

Specifically, the controller 11 sets the short-circuit switch SW2 in the open state and positions the changeover switch SW3 at the side of the second memory 22 more frequently than it sets the short-circuit switch SW2 in the closed state and positions the changeover switch SW3 at the side of the first memory 21. Thus, the signal lines L connecting the sensor unit 20 and the chopper amplifier unit 10 can be less frequently short-circuited. This can shorten a period during which a load on the sensor device 1A increases by short-circuiting the two signal lines connecting the sensor unit 20 and the chopper amplifier unit 10.

Particularly, the controller 11 may cause a data of an output signal converted into a digital signal in the AD conversion circuit 12 to be stored in the first memory 21 only once at the start-up of the sensor device 1A. Thereafter, the controller 11 may maintain a state where the data of the output signal converted into the digital signal in the AD conversion circuit 12 is stored in the second memory 22. This process has the following advantages.

Specifically, the controller 11 sets the short-circuit switch SW2 in the closed state and positions the changeover switch SW3 at the side of the first memory 21 only once at the start-up of the sensor device 1A. Thereafter, the controller 11 maintains the state where the short-circuit switch SW2 is set in the open state and the changeover switch SW3 is positioned at the side of the second memory 22.

Thus, at the start-up of the sensor device 1A, a data of a digital signal reflecting the noise components, but not reflecting a voltage signal indicating a temperature change is stored in the first memory 21. Thereafter, data of digital signals reflecting the noise components and voltage signals indicating the temperature change are continually stored in the second memory 22.

As a result, differences between the data of the digital signal reflecting the noise components and the data of the digital signals continually updated thereafter and reflecting the noise components and the voltage signals indicating the temperature change are obtained by the subtractor 23.

By the controller 11 performing the above process, the chopper amplifier unit 10 and the AD conversion circuit 12 respectively process a voltage signal indicating the noise components only at the start-up of the sensor device 1A and thereafter process voltage signals indicating the temperature change in addition to the noise components.

As a result, the sensor device 1A can obtain a digital signal having noise components removed therefrom while causing the chopper amplifier unit 10 and the AD conversion circuit 12 to centrally process a voltage signal indicating a temperature change in addition to the noise components. Thus, the sensor device 1A can obtain the digital signal having the noise components removed therefrom while efficiently utilizing the chopper amplifier unit 10 and the AD conversion circuit 12 originally designed to obtain a voltage signal indicating a temperature change as a digital signal.

The controller 11 may perform the following process. A data of a digital signal reflecting noise components is regularly stored in the first memory with the short-circuit switch SW2 set in the closed state and the changeover switch SW3 positioned at the side of the first memory 21. Except for a period during which this process is performed, data of digital signals reflecting noise components and voltage signals indicating a temperature change are successively stored in the second memory 22 with the short-circuit switch SW2 set in the open state and the changeover switch SW3 positioned at the side of the second memory 22.

In this way, the sensor device 1A causes the data of the digital signal reflecting the noise components to be regularly stored in the first memory 21 and, except for the period during which this process is performed, causes the data of the digital signals reflecting the noise components and the voltage signals indicating the temperature change to be successively stored in the second memory 22.

As described above, since the sensor device 1A causes a data of a digital signal reflecting noise components to be regularly stored in the first memory 21, a data of a digital signal reflecting noise components whose voltage values have changed is stored in the first memory 21 even if the voltage values of the noise components change due to a change in the internal temperature of the sensor device 1A.

The sensor device 1A causes data of digital signals reflecting noise components and voltage signals indicating a temperature change to be successively stored in the second memory 22 except for the period during which a data of a digital signal reflecting noise components is stored in the first memory 21. Thus, the data of the digital signals reflecting the noise components whose voltage values have changed and the voltage signals indicating the temperature change are stored in the second memory 22 even if the voltage values of the noise components change due to a change in the internal temperature of the sensor device 1A.

As a result, in the sensor device 1A, a difference between a data of a digital signal reflecting noise components whose voltage values have changed and a data of a digital signal reflecting the noise components whose voltage values have changed and a voltage signal indicating a temperature change is obtained by the subtractor 23. Thus, the sensor device 1A can obtain a digital signal having noise components removed therefrom regardless of changes in the voltage values of the noise components.

The present invention is summarized below.

A sensor device according to one aspect of the present invention comprises a voltage detection type sensor unit for converting a physical quantity into a voltage value and outputting a voltage signal indicating the voltage value; a chopper amplifier unit for generating a modulation signal by chopping the voltage signal output from the sensor unit with a predetermined chopping frequency, amplifying the modulation signal into an amplification signal, then demodulating the amplification signal and outputting it as an output signal; an integration unit including an operational amplifier for amplifying a voltage difference between a voltage at a non-inverting input terminal and a voltage at an inverting input terminal, an input resistor connected to the inverting input terminal of the operational amplifier and a capacitor connected between the inverting input terminal and an output terminal of the operational amplifier and adapted to sample the output signal output from the chopper amplifier unit at a predetermined sampling frequency and integrate the sampled output signal; and a digital conversion unit for converting the output signal integrated by the integration unit into a digital signal.

According to this construction, the integration unit including at least the operational amplifier is provided.

The operational amplifier has a property of decreasing an amplification factor as the frequency of an input signal increases when the frequency of this signal exceeds a predetermined frequency. Thus, the integration unit can have a function of decreasing an amplification factor as the frequency of a received output signal increases when the frequency of this output signal exceeds the predetermined frequency. By being provided with this function, the integration unit permits the passage of an input signal if the frequency of this signal is equal to or below the predetermined frequency while making the passage of the input signal more difficult as the frequency of this signal increases beyond the predetermined frequency.

Thus, the integration unit can perform a function as a low-pass filter without making it necessary to separately provide a low-pass filter. An integral value by the integration unit is converted into a digital signal by the digital conversion unit. Therefore, a sensor device can be provided which is capable of digital conversion while removing noise components mixed during an amplification process without increasing the circuit size of the sensor device.

In the above construction, a sampling frequency adjustment unit for adjusting the sampling frequency may be further provided.

As described above, in the integration unit, the amplification factor decreases as the frequency of a received output signal increases when the frequency of this output signal exceeds the predetermined frequency. The predetermined frequency at or above which the amplification factor decreases is determined by the magnitude of the sampling frequency.

As a result, the integration unit functions as a low-pass filter which makes the passage of a received output signal more difficult as the frequency of the output signal increases beyond a certain frequency determined by the magnitude of the sampling frequency. Thus, the integration unit can make the passage of noise components having frequencies above the certain frequency determined by the magnitude of the sampling frequency more difficult if the magnitude of the sampling frequency is determined.

According to this construction, the sampling frequency is adjusted by the sampling frequency adjustment unit. Thus, out of noise components in a certain frequency band included in the output signal input to the integration unit, the frequencies of those that should be made difficult to pass the integration unit can be adjusted. Thus, out of the noise components in the certain frequency band mixed in the output signal trying to pass the integration unit, those having the frequencies beyond the certain frequency determined by the magnitude of the sampling frequency can be removed. As a result, a ratio of the noise components in the signal passing the integration unit can be adjusted.

In the above construction, the chopping cycle and the sampling cycle may be synchronized and the chopping frequency may be an n-fold of the sampling frequency (where n is a natural number equal to or greater than 1).

When the frequency of an output signal input to an integrator (integration unit) increases from 0 to a sampling frequency, a voltage value of a signal output from the integrator decreases from a predetermined voltage value to 0. Thereafter, every time the frequency of the output signal input to the integrator becomes two or greater natural number times as high as the sampling frequency, the voltage value of the signal output from the integrator becomes 0. In other words, every time the frequency of the output signal input to the integrator becomes a multiple of the sampling frequency, the voltage value of the signal output from the integrator becomes 0 (see above literature 2 and FIG. 5).

The noise components mixed into the voltage signal during the amplification process in the chopper amplifier unit become amplification signals having the chopping frequency and its odd number multiples.

According to this construction, the chopping cycle and the sampling cycle are synchronized and the chopping frequency is the n-fold of the sampling frequency (where n is a natural number equal to or greater than 1). Thus, the chopping frequency and its odd number multiples coincide with the sampling frequency and its multiples at which the voltage value of the output signal output from the integrator becomes 0.

Thus, even if a voltage signal having the chopping frequency or its odd number multiple is input to the integrator (integration unit), the voltage value of the output signal output from the integrator becomes 0. Therefore, noise components mixed in the voltage signal having the chopping frequency or its odd number multiple are not reflected on the output signal from the integrator.

Hence, the noise components mixed in the voltage signal from the sensor signal can be accurately removed.

In the above construction, the sensor device may further comprise an oscillation unit including a CR oscillation circuit composed of a resistor and a capacitor and adapted to generate clock pulses which are used to actuate the chopper amplifier unit and the integration unit and serve as a basis for a pulse signal (sampling signal) having the sampling frequency, and the resistor and the capacitor of the oscillation unit may have the same temperature characteristics as the input resistor and the capacitor of the integration unit.

An amplification factor in the integration unit that operates on the pulses by the oscillation unit is determined by a ratio of a resistance value of the resistor of the oscillation unit to that of the input resistor of the integration unit. This amplification factor in the integration unit is also determined by a ratio of a capacitance of the capacitor of the oscillation unit to that of the capacitor of the integration unit.

According to this construction, the resistor and the capacitor of the oscillation unit have the same temperature characteristics as the input resistor and the capacitor of the integration unit. Thus, when an internal temperature of the sensor device changes, the resistance values of the oscillation unit and the integration unit change by the same amount and the capacitances of the oscillation unit and the integration unit change by the same amount.

As a result, even if the internal temperature of the sensor device changes, the ratio of the resistance value of the resistor of the oscillation unit to that of the input resistor of the integration unit and the ratio of the capacitance of the capacitor of the oscillation unit to that of the capacitor of the integration unit do not change. Therefore, a change of the amplification factor in the integration unit can be suppressed when the internal temperature of the sensor device changes.

In the above construction, the sensor device may further comprise an oscillation unit including a CR oscillation circuit composed of a resistor and a capacitor and adapted to generate clock pulses which are used to actuate the chopper amplifier unit and the integration unit and serve as a basis for a pulse signal (sampling signal) having the sampling frequency, and the resistor and the capacitor of the oscillation unit have the same electrical characteristics as the input resistor and the capacitor of the integration unit.

As described above, the amplification factor in the integration unit that operates on the pulses by the oscillation unit is determined by the ratio of the resistance value of the resistor of the oscillation unit to that of the input resistor of the integration unit. This amplification factor in the integration unit is also determined by the ratio of the capacitance of the capacitor of the oscillation unit to that of the capacitor of the integration unit.

According to this construction, the resistor and the capacitor of the oscillation unit have the same electrical characteristics as the input resistor and the capacitor of the integration unit. Here, a sheet resistance characteristic is cited as an example of the electrical characteristic.

Thus, when a process variation occurs during the manufacturing of the resistor of the oscillation unit and the input resistor of the integration unit, the resistance value of the resistor of the CR oscillation circuit and that of the input resistor of the integration unit change by the same amount since the resistor of the CR oscillation circuit and the input resistor of the integration unit have the same electrical characteristic. Therefore, the ratio of the resistance value of the resistor of the CR oscillation circuit to that of the input resistor of the integration unit does not change even if a process variation occurs during the manufacturing of the resistor of the CR oscillation circuit and the input resistor of the integration unit.

Further, when a process variation occurs during the manufacturing of the capacitor of the CR oscillation circuit and the capacitor of the integration unit, the capacitance of the capacitor of the CR oscillation circuit and that of the capacitor of the integration unit change by the same amount since the capacitor of the CR oscillation circuit and the capacitor of the integration unit have the same electrical characteristic. Therefore, the ratio of the capacitance of the capacitor of the CR oscillation circuit to that of the capacitor of the integration unit does not change even if a process variation occurs during the manufacturing of the capacitor of the CR oscillation circuit and the capacitor of the integration unit.

Accordingly, a change of the amplification factor in the integration unit can be suppressed even if a process variation occurs during the manufacturing of the resistor of the CR oscillation circuit and the input resistor of the integration unit or a process variation occurs during the manufacturing of the respective capacitors of the CR oscillation circuit and the integration unit.

In the above construction, the sensor device may further comprise a first storage and a second storage for storing a data of the output signal converted into the digital signal in the digital conversion unit; a cutoff portion for cutting off an output of the voltage signal from the sensor unit to the chopper amplifier unit; a selector for selecting in which of the first and second storages the data of the output signal from the digital conversion unit is to be stored; a control unit for causing the data of the output signal converted into the digital signal in the digital conversion unit to be stored in the first storage with the cutoff portion caused to cut off the output of the voltage signal from the sensor unit to the chopper amplifier unit and the selector caused to select the storage of the data of the output signal from the digital conversion unit in the first storage and causing the data of the output signal converted into the digital signal in the digital conversion unit to be stored in the second storage without the cutoff portion being caused to cut off the output of the voltage signal from the sensor unit to the chopper amplifier unit and with the selector caused to select the storage of the data of the output signal from the digital conversion unit in the second storage; and a subtractor for calculating a difference between the data of the output signal stored in the first storage and that of the output signal stored in the second storage.

According to this construction, the data of the output signal from the digital conversion unit is stored in the first storage with the output of the voltage signal from the sensor unit to the chopper amplifier unit cut off. Further, the output signal from the digital conversion unit is stored in the second storage without the output of the voltage signal from the sensor unit to the chopper amplifier unit being cut off. Then, the difference between the data of the output signal stored in the first storage and that of the output signal stored in the second storage is calculated.

This enables the calculation of a difference between a digital signal having noise components mixed therein and indicating a temperature change and a digital signal indicating only the noise components. Thus, it is possible to obtain a digital signal having the noise components inherent in the sensor device removed and indicating the temperature change, wherefore the temperature of an object can be more accurately measured.

In the above construction, the sensor unit and the chopper amplifier unit may be connected by a plurality of signal lines for transmitting the voltage signal from the sensor unit; the cutoff portion may be a short-circuit switch for short-circuiting the plurality of signal lines; the selector may be a changeover switch for connecting either one of the first and second storages to the digital conversion unit; and the control unit may be able to control the selector and the cutoff portion such that the data of the output signal converted into the digital signal in the digital conversion unit is stored in the second storage more frequently than in the first storage.

According to this construction, the selector and the cutoff portion are controlled such that the output signal is stored in the second storage more frequently than in the first storage. Thus, the data of the output signal from the digital conversion unit is stored more frequently in the second storage without the output of the voltage signal from the sensor unit to the chopper amplifier unit being cut off than in the first storage with the output of the voltage signal from the sensor unit to the chopper amplifier unit cut off.

Accordingly, the state where the output of the voltage signal from the sensor unit to the chopper amplifier unit is cut off occurs less frequently than the state where the output of the voltage signal from the sensor unit to the chopper amplifier unit is not cut off.

As a result, the plurality of signal lines connecting the sensor unit and the chopper amplifier unit can be less frequently short-circuited, therefore suppressing an increase of a load on the sensor device caused by short-circuiting the signal lines connecting the sensor unit and the chopper amplifier unit.

In the above construction, the sensor device may further comprise an integration control unit; the integration control unit may execute a control to generate the output signal integrated by the integration unit by causing the operational amplifier to charge the capacitor by inputting the output signal output from the chopper amplifier unit to the inverting input terminal during a predetermined sampling period in every sampling cycle which is an inverse of the sampling frequency and causing the capacitor to discharge after the lapse of the sampling period and execute a control to terminate an integration process when a voltage of the output signal output from the chopper amplifier unit reaches a predetermined reference voltage; and the digital conversion unit may include a time meter for measuring a time until the end of the integration process after the lapse of the sampling period in a digital value and outputting the measured time in the digital value as the digital signal.

This construction is a specific construction of the sensor device according to one aspect of the present invention. Accordingly, effects brought about by the sensor device according to one aspect of the present invention can be realized.

In the above construction, the integration control unit may cause the capacitor to discharge by applying the reference voltage having a polarity opposite to that of a voltage of the output signal output from the chopper amplifier unit to the inverting input terminal after the lapse of the sampling period.

According to this construction, the capacitor of the integration unit can be caused to discharge since the reference voltage having the polarity opposite to that of the voltage of the output signal output from the chopper amplifier unit is applied to the inverting input terminal.

In the above construction, the sensor device may further comprise an oscillation unit including a CR oscillation circuit composed of a resistor and a capacitor and adapted to generate clock pulses which are used to actuate the chopper amplifier unit and the integration unit and serve as a basis for a pulse signal having the sampling frequency; the resistor and the capacitor of the oscillation unit may have the same temperature characteristics as the input resistor and the capacitor of the integration unit; and the integration control unit may control charging and discharging of the capacitor of the operational amplifier based on the pulse signal.

According to this construction, effects brought about by the above feature that the resistor and the capacitor of the oscillation unit have the same temperature characteristics as the input resistor and the capacitor of the integration unit can be obtained.

In the above construction, the sensor device may further comprise an oscillation unit including a CR oscillation circuit composed of a resistor and a capacitor and adapted to generate clock pulses which are used to actuate the chopper amplifier unit and the integration unit and serve as a basis for a pulse signal having the sampling frequency; the resistor and the capacitor of the oscillation unit may have the same electrical characteristics as the input resistor and the capacitor of the integration unit; and the integration control unit may control charging and discharging of the capacitor of the operational amplifier based on the pulse signal.

According to this construction, effects brought about by the above feature that the resistor and the capacitor of the oscillation unit have the same electrical characteristics as the input resistor and the capacitor of the integration unit can be obtained.

The invention claimed is:

1. A sensor device, comprising:
   a voltage detection type sensor for converting a physical quantity into a voltage value and outputting a voltage signal indicating the voltage value;
   a chopper amplifier for generating a modulation signal by chopping the voltage signal output from the sensor with a predetermined chopping frequency, amplifying the modulation signal into an amplification signal, then demodulating the amplification signal and outputting the demodulated amplification signal as an output signal including noise components having the chopping frequency and odd number multiples frequency of the chopping frequency;
   an integrator including an operational amplifier for amplifying a voltage difference between a voltage at a non-inverting input terminal and a voltage at an inverting input terminal, an input resistor connected to the inverting input terminal of the operational amplifier and a capacitor connected between the inverting input terminal and an output terminal of the operational amplifier and adapted to sample the output signal output from the chopper amplifier at a predetermined sampling frequency and integrate the sampled output signal;
   a sampling frequency adjuster that reduces the noise components that pass the integrator by adjusting the sampling frequency so that the chopping frequency is an n-fold of the sampling frequency, where n is a natural number equal to or greater than 1;
   the integration controller executes a control to generate the output signal integrated by the integrator by causing the operational amplifier to charge the capacitor by inputting the output signal output from the chopper amplifier to the inverting input terminal during a predetermined sampling period in every sampling cycle which is an inverse of the sampling frequency and causing the capacitor to discharge after the lapse of the sampling period; and
   a digital converter for converting the output signal integrated by the integrator into a digital signal.

2. A sensor device according to claim 1, further comprising:
   an oscillator including a CR oscillation circuit having a resistor and a capacitor and adapted to generate clock pulses which are used to actuate the chopper amplifier and the integrator and serve as a basis for a pulse signal having the sampling frequency,
   wherein the resistor and the capacitor of the oscillator have the same temperature characteristics as the input resistor and the capacitor of the integrator.

3. A sensor device according to claim 1, further comprising:
   an oscillator including a CR oscillation circuit having a resistor and a capacitor and adapted to generate clock pulses which are used to actuate the chopper amplifier and the integrator and serve as a basis for a pulse signal having the sampling frequency,
   wherein the resistor and the capacitor of the oscillator have the same electrical characteristics as the input resistor and the capacitor of the integrator.

4. A sensor device according to claim 1, further comprising:
   a first storage and a second storage for storing a data of the output signal converted into the digital signal in the digital converter;
   a cutoff portion for cutting off an output of the voltage signal from the sensor to the chopper amplifier;
   a selector for selecting the first storage or the second storage to be stored the data of the output signal from the digital converter;
   a controller for causing the data of the output signal that is converted into the digital signal in the digital converter to be stored in the first storage, with the cutoff portion cutting caused to cut off the output of the voltage signal from the sensor to the chopper amplifier and with the selector selecting the storage of the data of the output signal from the digital converter in the first storage, and for causing the data of the output signal that is converted into the digital signal in the digital converter to be stored in the second storage without the cutoff portion cutting off the output of the voltage signal from the sensor to the chopper amplifier and with the selector selecting the storage of the data of the output signal from the digital converter in the second storage; and a subtractor for calculating a difference between the data of the output signal stored in the first storage and that of the output signal stored in the second storage.

5. A sensor device according to claim 4, wherein the sensor and the chopper amplifier are connected by a plurality of signal lines for transmitting the voltage signal from the sensor;

the cutoff portion is a short-circuit switch for short-circuiting the plurality of signal lines;

the selector is a changeover switch for connecting either one of the first and second storages to the digital converter; and the controller controls the selector and the cutoff portion such that the data of the output signal converted into the digital signal in the digital converter is stored in the second storage more frequently than in the first storage.

6. A sensor device according to claim 1, wherein the integration controller executes a control to terminate an integration process when a voltage of the output signal output from the chopper amplifier reaches a predetermined reference voltage; and the digital converter includes a time meter for measuring a time until the end of the integration process after the lapse of the sampling period in a digital value and outputting the measured time in the digital value as the digital signal.

7. A sensor device according to claim 6, wherein the integration controller causes the capacitor to discharge by applying the reference voltage having a polarity opposite to that of a voltage of the output signal output from the chopper amplifier to the inverting input terminal after the lapse of the sampling period.

8. A sensor device according to claim 6, further comprising:

an oscillator including a CR oscillation circuit having a resistor and a capacitor and adapted to generate clock pulses which are used to actuate the chopper amplifier and the integrator and serve as a basis for a pulse signal having the sampling frequency, wherein the resistor and the capacitor of the oscillator have the same temperature characteristics as the input resistor and the capacitor of the integrator; and the integration controller controls charging and discharging of the capacitor of the operational amplifier based on the pulse signal.

9. A sensor device according to claim 6, further comprising:

an oscillator including a CR oscillation circuit having a resistor and a capacitor and adapted to generate clock pulses which are used to actuate the chopper amplifier and the integrator and serve as a basis for a pulse signal having the sampling frequency, wherein the resistor and the capacitor of the oscillator have the same electrical characteristics as the input resistor and the capacitor of the integrator; and the integration controller controls charging and discharging of the capacitor of the operational amplifier based on the pulse signal.

\* \* \* \* \*